United States Patent
Ray et al.

(10) Patent No.: US 7,026,254 B2
(45) Date of Patent: Apr. 11, 2006

(54) MANUFACTURE OF MASKS AND ELECTRONIC PARTS

(75) Inventors: Kevin Barry Ray, Leeds (GB); Anthony Paul Kitson, Batley (GB)

(73) Assignee: Eastman Kodak Company, Rochester, NY (US)

( * ) Notice: Subject to any disclaimer, the term of this patent is extended or adjusted under 35 U.S.C. 154(b) by 171 days.

(21) Appl. No.: 10/405,403

(22) Filed: Apr. 2, 2003

(65) Prior Publication Data

US 2003/0203187 A1 Oct. 30, 2003

Related U.S. Application Data

(62) Division of application No. 09/472,470, filed on Dec. 27, 1999, now Pat. No. 6,558,787.

(51) Int. Cl.
*H01L 21/302* (2006.01)

(52) U.S. Cl. .................. 438/745; 438/750; 216/16; 430/312

(58) Field of Classification Search .............. 438/745, 438/750, 751, 316, 700; 216/12, 16; 430/302, 430/310, 316, 3, 313
See application file for complete search history.

(56) References Cited

U.S. PATENT DOCUMENTS

| | | | |
|---|---|---|---|
| 3,554,125 A | 1/1971 | Van Dorn | |
| 3,628,953 A | 12/1971 | Brinckman | |
| 3,847,614 A | 11/1974 | Mattor | |
| 4,072,527 A | 2/1978 | Fan | |
| 4,115,128 A | 9/1978 | Kita | |
| 4,268,608 A | 5/1981 | Muzyczko et al. | |
| 4,592,977 A | 6/1986 | Naganuma et al. | |
| 4,732,837 A | 3/1988 | Potvin et al. | |
| 4,732,840 A | 3/1988 | Hasegawa | |
| 4,751,170 A | 6/1988 | Mimura et al. | |
| 4,935,330 A | 6/1990 | Hofmann et al. | |
| 5,304,453 A | 4/1994 | Lin | |
| 5,310,619 A | 5/1994 | Crivello et al. | |
| 5,340,693 A | 8/1994 | Uytterhoeven et al. | |
| 5,362,496 A | 11/1994 | Baker et al. | |
| 5,362,607 A | 11/1994 | Crivello et al. | |
| 5,387,496 A | 2/1995 | DeBoer | |
| 5,401,618 A | 3/1995 | Chapman et al. | |
| 5,417,835 A * | 5/1995 | Brown et al. ........... | 204/403.06 |
| 5,429,909 A | 7/1995 | Kaszczuk et al. | |
| 5,459,017 A | 10/1995 | Topel, Jr. et al. | |
| 5,470,693 A * | 11/1995 | Sachdev et al. ............ | 430/315 |
| 5,512,418 A | 4/1996 | Ma | |
| 5,516,620 A | 5/1996 | Cheng et al. | |
| 5,563,019 A | 10/1996 | Blanchet-Fincher | |
| 5,607,814 A | 3/1997 | Fan et al. | |
| 5,616,600 A * | 4/1997 | Kaneko et al. ............. | 514/397 |
| 5,641,608 A | 6/1997 | Grunwald et al. | |
| 5,677,041 A * | 10/1997 | Smayling .................... | 257/66 |
| 5,688,627 A | 11/1997 | Deutsch | |
| 5,725,989 A | 3/1998 | Chang et al. | |
| 6,153,353 A | 11/2000 | Van Damme et al. | |
| 6,352,812 B1 | 3/2002 | Shimazu et al. | |

FOREIGN PATENT DOCUMENTS

| | | |
|---|---|---|
| EP | 197519 | 10/1986 |
| EP | 557138 | 8/1993 |
| EP | 800928 | 10/1997 |
| EP | 803771 | 10/1997 |
| EP | 803772 | 10/1997 |
| EP | 864420 | 9/1998 |
| EP | 881094 | 12/1998 |
| EP | 901902 | 3/1999 |
| EP | 908305 | 4/1999 |
| EP | 908307 | 4/1999 |
| EP | 908779 | 4/1999 |
| EP | 1101608 | 5/2001 |
| GB | 9821756.5 | 7/1998 |
| JP | 11147378 A | 5/1999 |
| JP | 11149162 A | 6/1999 |
| WO | 99/08879 | 2/1999 |

\* cited by examiner

*Primary Examiner*—Lan Vinh

(57) ABSTRACT

A precursor that may be imaged by heat is made up of a substrate, for example a copper board, and a composite layer structure composed of two layers. Preferably, the first layer is composed of an aqueous developable polymer mixture containing a photothermal conversion material, which is contiguous to the substrate. The second layer of the composite is composed of one or more non-aqueous soluble polymers, which are soluble or dispersible in a solvent which does not dissolve the first layer. The precursor is exposed with an infrared laser or a thermal print head, and upon aqueous development, the exposed regions are removed, revealing regions of the substrate surface able to be etched or otherwise treated. The second layer may also contain a photothermal conversion material. Alternatively, the composite layer may be free of photothermal conversion material when thermal imaging is carried out using a thermal print head. The precursor may be used, for example, as a mask precursor or electronic part precursor.

9 Claims, No Drawings

MANUFACTURE OF MASKS AND ELECTRONIC PARTS

CROSS-REFERENCE TO RELATED APPLICATION

This application is a divisional application of U.S. patent application Ser. No. 09/472,470, filed Dec. 27, 1999, now U.S. Pat. No. 6,558,787 entitled "Improvements in Relation to Manufacture of Masks and Electronic Parts."

FIELD OF THE INVENTION

This invention relates to positive working precursors, which may be used in masks and electronic parts and to methods of making such precursors using imageable compositions and to masks and electronic parts made using such precursors.

BACKGROUND

Effective thermally imageable compositions suitable for use as imageable coatings on masks and on precursors for printed circuit and other electronic parts are described in WO99/08879. However there are some situations where these compositions are not optimal. For example they may not be sufficiently physically robust for some applications, particularly when coated on both sides of a thin, flexible substrate. Although there are available other compositions which are more physically robust, these generally require more imaging energy for a given dissolution rate in a given developer.

Accordingly, there remains a need for technological advances in relation to thermally imageable articles for use in mask and electronic part manufacture; and in particular there remains a need for articles which have a coating which is both physically robust and have good image forming characteristics.

The types of electronic parts whose manufacture may use an imageable coating include printed wiring boards (PWBs), thick- and thin-film circuits, comprising passive elements such as resistors, capacitors and inductors; multichip devices (MDCs); integrated circuits (ICs); and active semiconductor devices. The electronic parts may suitably comprise conductors, for example copper board; semiconductors, for example silicon or germanium; and insulators, for example silica as a surface layer with silicon beneath, with the silica being selectively etched away to expose portions of the silicon beneath (a step in the manufacture of e.g. field effect transistors). In relation to masks, a required pattern may be formed in the coating on the mask precursor, which is then used as a mask in a later processing step, in forming a pattern on, for example, a printing or electronic part substrate.

SUMMARY OF THE INVENTION

The present invention provides a positive working precursor comprising:
A. a substrate; and
B. a thermally sensitive composite layer structure having an inner surface contiguous to the substrate and an outer surface, the composite layer structure comprising:
  (a) a first layer having the inner surface, the first layer comprising a first polymeric material, wherein the first polymeric material is soluble or dispersible in an aqueous solution; and
  (b) a second layer having the outer surface, the second layer comprising a second polymeric material, wherein the second layer is insoluble in the aqueous solution; wherein, upon heating the composite layer structure, the heated composite layer structure has an increased rate of removal in the aqueous solution.

A further embodiment of this invention provides a method of making a mask or an electronic part, the method comprising the steps of
I) providing a precursor for the mask or electronic part, the precursor comprising:
A. a substrate; and
B. a thermally sensitive composite layer structure having an inner surface contiguous to the substrate and an outer surface, the composite layer structure comprising:
  (a) a first layer having the inner surface, the first layer comprising a first polymeric material, wherein the first polymeric material is soluble or dispersible in an aqueous solution; and
  (b) a second layer having the outer surface, the second layer comprising a second polymeric material, wherein the second layer is insoluble in the aqueous solution;
II) imagewise exposing the composite layer structure to thermal energy to provide exposed portions and complimentary unexposed portions in the composite layer structure, wherein the exposed portions of the composite layer structure are selectively removable by the aqueous solution; and
III) applying the aqueous solution to the outer surface to remove the exposed portions of the composite layer structure to produce an imaged article having uncovered areas of the substrate and complimentary remaining regions of the composite layer structure.

In each of the embodiments of this invention the aqueous solution preferably has a pH of about 6 or greater. The second polymeric material is preferably soluble in an organic solvent; the first polymeric material is preferably insoluble in that organic solvent; and the first layer preferably contains a photothermal conversion material particularly when the element is imagewise exposed with the radiant source of energy such as an infrared emitting laser. Preferably, the second layer is free of the photothermal conversion material.

DETAILED DESCRIPTION OF THE INVENTION

This invention relates to precursors, which can be imaged with thermal energy. More particularly, this invention relates to precursors for masks and, especially, for electronic parts, which can be imaged by thermal energy typically by imagewise exposure with an infrared emitting laser, a thermal printing head, or the like. The mask or electronic part precursors described in this invention are made up of a substrate, which may comprise an insulating, semiconductor or conductive surface, and which need not be hydrophilic, and adhered thereto, a thermally sensitive composite layer structure typically composed of two layer coatings. An aqueous developable polymeric mixture typically containing a photothermal conversion material is coated onto the substrate to form the first layer. The second layer is composed of one or more non-aqueous soluble polymeric materials, which are soluble or dispersible in a solvent that does not dissolve the first layer or cause detrimental intermixing of the two layers. In the positive-working thermal imaging element of this invention, the term "photothermal conversion material" is intended to be one or more thermally sensitive components, which absorb incident radiation and convert the radiation to thermal energy. Typically, the photothermal conversion material is an "infrared absorbing" compound. As used herein, the term "thermally sensitive" is intended to be synonymous with the term "heat sensitive". The precursor is exposed, typically with an infrared laser or a thermal print head. Upon aqueous development of the imaged precursor, the exposed portions are developed away thus exposing regions of the surface of the substrate which are receptive to conventional aqueous developer solutions. The second layer protects the underlying aqueous-soluble coating areas from the aqueous solution. In one embodiment of this invention, only the first layer contains a photothermal conversion material. In another embodiment of the invention the second layer contains a photothermal conversion material. In this instance, imaging exposure may result in at least partial removal of exposed areas of the second layer from the underlying coating. Any remaining exposed areas of the second layer are removed during development of the imaged precursor. In the following description, the invention will be illustrated using infrared radiation, and infrared absorbing material as the photothermal conversion material, but is not intended to be limited thereby. In another embodiment both layers contain a photothermal conversion material; the photothermal material in the first layer may be the same as or different from the photothermal to conversion material of the first layer.

Precursor Construction

The precursor of the present invention includes a composite layer structure supported by a substrate. The composite layer structure contains at least an aqueous-insoluble second layer overlying an aqueous-soluble layer, which contains an infrared absorber, the composite layer being adhered to the surface of the substrate. The composite structure may additionally contain intermediate layers such as substrate subbing layers to enhance adhesion to the composite structure, or an adhesion promoting interlayer between the second layer and the infrared absorbing layer.

The electronic part may, for example, be any of the electronic parts mentioned in this specification.

Substrate

The substrate may be a semiconductor in which case the method may involve one or more subsequent doping steps selectively in regions in which the composition has been removed, such doping steps being for example by vapor phase, liquid immersion or by ion implantation methods. The substrate may also be an insulator which is etched to reveal a conductive or semiconductor layer below. For example the substrate may be silica etched to reveal silicon. Alternatively the substrate may be a conductive surface on which a wiring pattern is to be formed, for example by etching the printed circuit precursor in an etchant to remove said conductive surface selectively in the said regions.

The substrate of an electronic part precursor referred to herein is different from the base used for lithographic printing plates. In particular, in this invention the surface is not an aluminum plate which has undergone the usual anodic graining and post-anodic treatments well known in the lithographic art for enabling a radiation sensitive composition to be coated thereon and for the surface of the plate to function as a printing surface. More preferably it is not a metallic plate treated for use as a printing plate. More preferably when the surface is conductive it is a copper or a copper-rich alloy. Preferably such a surface is supported by an insulating substrate. The insulating substrate is suitably a dimensionally stable plastics board, for example of epoxy resin reinforced by glass fibers.

While the substrate defined herein may have a surface insulator which requires selective etching to remove portions thereof to reveal an electroactive layer beneath it, preferably the surface itself is an electroactive layer. Electroactive means a conductor, a semiconductor or a material which when doped functions as a semiconductor. Most preferably the surface is a conductor.

The invention may also be applied to the manufacture of masks. Masks are used in some imaging methods, whether in the context of printing or circuit board substrates, with the required resist pattern being formed in the coating on the mask precursor, which is then used as a mask or screen, in a later processing step. One example of such a process is the flexographic process. The invention may in particular be applied to the manufacture of masks requiring the removal of only a proportion of the full depth of the composite layer structure where heated, rather than the full depth thereof.

The heat-sensitive composite layer structures described herein may be coated onto a film, forming a mask precursor, and heat-imaged, and developed, to provide a mask. The mask precursor may be imaged to leave the composition thereon in different depths at different locations, after development. The resulting mask may then usefully be applied over a printing substrate and flood exposed, for example using a UV light source.

Thermally-Sensitive Composite Layer Structure

First Layer:

The first layer of the composite layer structure is composed of a polymeric material and optionally, a first photothermal conversion material such as an infrared absorbing compound, in which the polymeric material is soluble or dispersible in an aqueous solution having a pH of about 6 or greater, i.e., in a slightly acidic, neutral or alkaline aqueous solution. Optionally, the first layer may contain a photohardenable material in addition to the thermal conversion material. Useful polymeric materials contain acid functionality and may be composed of one or more polymers or resins. Such polymers and resins include carboxy functional acrylics, acrylics which contain phenol groups and/or sulfonamide groups, cellulosic based polymers and copolymers, vinyl acetate/crotonate/vinyl neodecanoate copolymers, styrene maleic anhydride copolymers, polyvinyl acetals, phenolic resins, maleated wood rosin, and combinations thereof. Typically two polymers are used in combination to achieve the desirable solubility in a wholly aqueous solution having a pH of about 6 or greater and typically between about 8 and about 13.5. A further criterion for the polymeric material, is that it be insoluble in an organic solvent for the second layer hereinafter discussed.

In a preferred embodiment of this invention, the first layer contains a first photothermal conversion material such as an infrared absorber. An infrared absorber may be selected from either a dye or pigment. A primary factor in selecting the infrared absorber is its extinction coefficient, which measures the efficiency of the dye or pigment in absorbing infrared radiation in accordance with Beer's Law. The extinction coefficient must have a sufficient value in the wavelength region of infrared radiation exposure usually from 780 nm to 1300 nm. Examples of infrared absorbing dyes useful in the present invention include, Cyasorb IR 99 and Cyasorb IR 165 (both available from Glendale Protective Technology), Epolite IV-62B and Epolite III-178 (both available from the Epoline Corporation), PINA-780 (available from the Allied Signal Corporation), Spectra IR 830A and Spectra IR 840A (both available from Spectra Colors Corporation), ADS 830A and ADS 1060A (ADS Corp) and EC 2117 (FEW Wolfen). Examples of infrared absorbing pigments are Projet 900, Projet 860 and Projet 830 (all available from the Zeneca Corporation). Carbon black pigments may also be used. Carbon black pigments are particularly advantageous due to their wide absorption bands since such carbon black-based plates can be used with multiple infrared imaging devices having a wide range of peak emission wavelengths.

Second Layer:

The second layer of the composite layer structure, i.e. the top layer, contains a polymeric material, is insoluble in the aqueous solution having a pH of about 6 or greater, and is soluble or dispersible in a solvent such as an organic solvent or an aqueous solvent dispersion. Useful polymers of this type include acrylic polymers and copolymers; polystyrene; styrene-acrylic copolymers; polyesters, polyamides; polyureas; polyurethanes; nitrocellulosics; epoxy resins; and combinations thereof. Preferred are polymethylmethacrylate and polystyrene. The second layer may contain a photothermal conversion material, which typically is the same infrared absorbing dye which is used as a photothermal conversion material (when present) in the first infrared absorbing layer. The second layer may also contain a dye or pigment, such as a printout dye added to distinguish the exposed areas from the unexposed areas during processing; or a contrast dye to distinguish image areas in the finished imaged plate. The second layer may also contain polymeric particles, which are incompatible with the second polymeric material. As used herein the term "incompatible" is intended to mean that the polymeric particles are retained as a separate phase within the second polymeric material. Typically, the polymeric particles have an average diameter between about 0.5 µm and about 10 µm. Preferred polymeric particles of this type are polytetrafluoroethylene particles. The presence of such polymeric particles improves scratch resistance of the composite layer structure and surprisingly enhances exposure latitude for processing the precursor. Typically, the second layer is substantially free of ionic groups.

Precursor Preparation

The composite layer structure may be applied to the substrate by sequentially applying the first layer and then the second layer using conventional coating or lamination methods. Alternatively, both layers may be applied at the same time or from a single solution, which undergoes self-stratification into top and bottom layers upon drying. However it is important to avoid intermixing the two layers which tends to reduce the sensitivity. Regardless of the method of application, the first layer of the applied composite has an inner surface, which is contiguous to the substrate, and the second layer of the applied composite has an outer surface, which may be non-oleophilic.

The first layer may be applied to the substrate by any conventional method. Typically the ingredients are dissolved or dispersed in a suitable coating solvent, and the resulting solvent mixture is coated by known methods such as by whirl coating, bar coating, gravure coating, roller coating, and the like. Suitable coating solvents include alkoxyalkanols such as 2-methoxyethanol; ketones such as methyl ethyl ketone; esters such as ethyl acetate or butyl acetate; and mixtures thereof The second or top layer may be applied to the surface of the thermal conversion layer by any conventional method such as those described above. Typically the ingredients are dissolved or dispersed in a suitable organic coating solvent, which is not a solvent for the thermal conversion layer. Suitable coating solvents for coating the second layer include aromatic solvents such as toluene and mixtures of aromatic solvents with alkanols such as a 90:10 weight ratio of toluene and butanol.

Alternatively, the first layer, the second layer or both layers may be applied by conventional extrusion coating methods from a melt mixture of layer components. Typically, such a melt mixture contains no volatile organic solvents.

Imaging and Processing

The thermally imageable precursor is imaged by the method comprising the following steps. First a precursor is provided which comprises a substrate and adhered thereto, a composite layer structure having an inner surface contiguous to the substrate and an outer surface. The composite layer structure comprises a first layer, which forms the inner surface of the composite layer structure and a second layer that forms the outer surface of the composite layer structure. The first layer comprises a first polymeric material and optionally a photothermal conversion material, as previously described, in which the first polymeric material is soluble or dispersible in an aqueous solution having a pH of about 6 or greater, and which is insoluble in an organic solvent. The second layer consists essentially of a second polymeric material, as previously described, which is soluble in the organic solvent, and optionally a photothermal conversion material, wherein the second layer is insoluble in the aqueous solution. Next the composite layer structure is imagewise exposed to thermal energy to provide exposed portions, or areas, and complimentary unexposed portions, or areas, in the composite layer structure. The exposed portions surprisingly are selectively removable by the aqueous solution. Finally, the aqueous solution is then applied to the outer surface to remove the exposed portions of the composite layer structure to produce an imaged article. The resulting imaged article has uncovered regions of the substrate and complimentary remaining regions of the outer surface. While not being bound by any particular theory, selective removability of the exposed portions is believed to result from an increased rate of dissolution or dispersibility of the first layer in the aqueous solution, from enhanced permeability of the second layer to the aqueous solution or from a combination thereof.

Thus in accordance with the present invention a mask or an electronic part, whether a circuit or a circuit device, is obtained after heat-mode imaging and processing. On exposure to heat, preferably delivered by suitable radiation, the heated areas of the composite layer structure are rendered more soluble in the aqueous solution. Therefore on imagewise exposure there is a change in the solubility differential of the unexposed and of the exposed composite layer structure. Thus, in the exposed regions the composite layer structure is dissolved, preferably to the extent of revealing the underlying surface of the substrate. The revealed areas of the underlying surface can then be selectively subjected to a desired treatment, which in the case of electronic parts may entail etching, doping and/or deposition, and/or making electrical connections thereto. Desirably, after such treatment, the remaining areas of the composition are then removed. This may be achieved by heating the precursor to solubilize the remaining areas of the composition, then subjecting it to a developer; or, preferably, by subjecting it to a stripper liquid, for example acetone or strong alkali, for example an alkali metal hydroxide.

The precursors of the invention may be imaged with a laser or an array of lasers emitting infrared radiation in a wavelength region that closely matches the absorption spectrum of the first infrared absorbing layer. Suitable commercially available imaging devices include image setters such as a Creo Trendsetter (available from the CREO Corporation, British Columbia, Canada) and a Gerber Crescent 42T (available from the Gerber Corporation). While infrared lasers are preferred other high intensity lasers emitting in the visible or ultraviolet may also be used to image the precursors of this invention. Alternatively, the precursors of this invention may be imaged using a conventional apparatus containing a thermal printing head or any other means for imagewise conductively heating the composite layer such as with a heated stylus, with a heated stamp, or with a soldering iron as illustrated in the following examples.

In preferred methods of the invention electromagnetic radiation is used to expose the composite layer structure, the wavelength thereof entirely or predominantly exceeding 500 nm. Preferably, it is of wavelength entirely or predominantly exceeding 600 nm. More preferably it is of wavelength entirely or predominantly exceeding 700 nm. Most preferably it is of wavelength entirely or predominantly exceeding 780 nm. Suitably it is of wavelength entirely or predominantly below 1400 nm, preferably entirely or predominantly below 1300 nm. More preferably it is of wavelength entirely or predominantly below 1200 nm. Most preferably it is of wavelength entirely or predominantly below 1150 nm, especially below 1100 nm. Thus, suitably it is of wavelength entirely or predominantly in the range 600 to 1400 nm, more preferably 700 to 1200 nm, most preferably 800 to 1150 nm, especially 800 to 1100 nm.

Most preferably the radiation is delivered by a laser or array of lasers.

The developer solution may be any liquid or solution which can both penetrate the exposed areas and dissolve or disperse the exposed areas of the infrared absorbing layer without substantially affecting the complimentary unexposed portions of the composite layer structure. Useful developer liquids are the aqueous solutions having a pH of about 6 or above as previously described. Preferred developer solutions are those that have a pH between about 8 and about 13.5. Useful developers include aqueous alkaline developers notably alkali metasilicate developers. Typically the developer liquid is applied to the imaged precursor by rubbing or wiping the second layer with an applicator containing the developer solution. Alternatively, the imaged precursor may be brushed with the developer solution or the developer solution may be applied to the precursor by spraying the second layer with sufficient force to remove the exposed regions. Alternatively, the imaged precursor can be soaked in the developer solution, followed by rubbing or brushing the precursor with water. By such methods a developed article is produced which has uncovered regions and complimentary remaining areas of the composite layer structure, not exposed to infrared radiation.

The present invention will now be illustrated by the following examples, but is not intended to be limited thereby.

In these examples the following products are referred to:

Lyncur CBA (PVP-butylacrylate), a copolymer of p-vinylphenol supplied by Siber Hegner Ltd, Beckenham, UK, and having the structure:

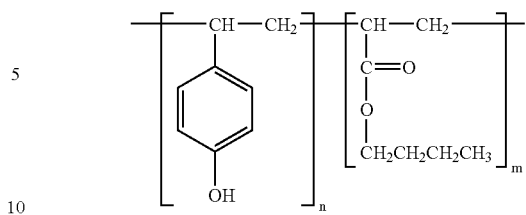

n/m=8/2–6/4

$M_w$=10,000–30,000 ($M_w$: weight average molecular weight)

$M_n$=5,000–5,500 ($M_n$: number average molecular weight)

Lyncur M(S-4), a polyvinyl phenol polymer supplied by Siber Hegner.

Crystal violet (basic violet 3, C.I. 42555, Gentian Violet) supplied by Aldrich Chemical Company of Dorset, UK having the structure:

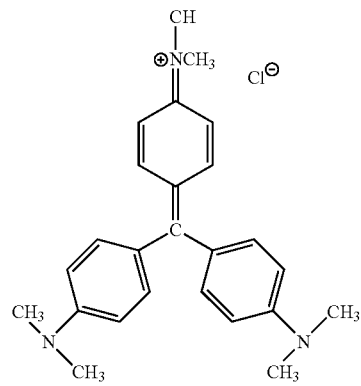

SDB 7047 supplied by HW Sands of Jupiter, Fla., USA believed to have the structure:

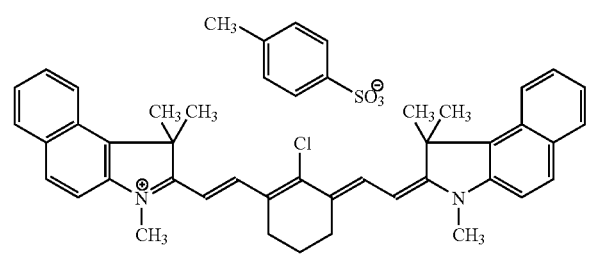

KF654B PINA as supplied by Riedel de Haan UK, Middlesex, UK, believed to have the structure:

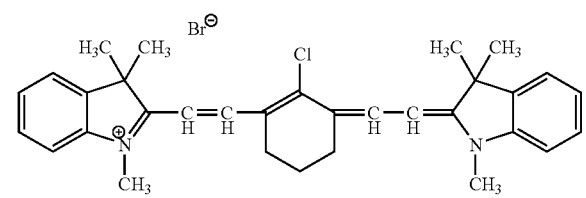

Poly (2-ethylhexyl methacrylate) as supplied by Aldrich Chemical Company, Dorset, UK.

Carbon black: Printex XE2 as supplied by Degussa of Macclesfield, UK.

Finaprene, a styrene butadiene copolymer as supplied by Fina Chemicals, Antwerp, The Netherlands.

Poly(methyl methacrylate), $M_w$=15000; poly(methyl methacrylate), $M_w$=120,000; and poly(methyl methacrylate), $M_w$=350,000; all supplied by Aldrich.

Piccolastic A75, a polystyrene resin as supplied by Hercules, Rijswijk, The Netherlands.

LB6564, a 1:1 phenol/cresol novolac resin supplied by Bakelite, UK.

Nitrocellulose DHX 3-5, a high nitrogen grade (11.7–12.2%) nitrocellulose in chip form as supplied by ICI Explosives of Ayrshire, Scotland.

Copper substrate A: double sided copper laminate of overall thickness 254 microns, having copper cladding 18 microns thick on each side of an insulating substrate, catalogue number N4105-2, 0.008, H/H HTE, as supplied by New England Laminates (UK) Limited of Skelmersdale, UK. The substrate is microetched by spray treating with Microetch, MECBrite MECCA92M (as supplied by Specialty Chemicals Ltd, Berwick-Upon-Tweed, UK), for 60 seconds at 20° C. using a spray processor as supplied by PCB Machinery Ltd, Haslingden, Lancashire, UK, then given an anti-tarnish treatment by rinsing in 2% aqueous citric acid (supplied by Aldrich), for 30 seconds, followed by thorough rinsing.

Copper substrate B: double sided copper laminate of overall thickness 254 microns, having reverse foil treated copper cladding 18 microns thick on each side of an insulating substrate, catalogue number N4105-2, 0.008, H/H MLS, as supplied by New England Laminates. The substrate is given an anti tarnish treatment by rinsing in 2% aqueous citric acid (supplied by Aldrich), for 30 seconds, followed by thorough rinsing.

Polyester substrate: Planfoil polyester montage foil, 300×400×0.18 mm as supplied by Kodak Polychrome Graphics, Leeds, UK.

Developer A: 14 wt % sodium metasilicate pentahydrate in water.

Developer B: 7 wt % sodium metasilicate pentahydrate in water.

Creo Trendsetter 3244—a commercially available plate setter, using Procomm Plus software, operating at a wavelength of 830 nm at powers of up to 8 W and supplied by Creo Products Inc., Burnaby, Canada.

Etching solution A: a cupric chloride, hydrochloric acid etch made up in the following ratios (by volume): —$CuCl_2$:HCl:Water of 6:4:10. The anhydrous $CuCl_2$ can be obtained from William Blyth Ltd, Oswaldtwistle, UK.

Stripper A: acetone as supplied by Aldrich Chemical Company.

The coating formulations for the examples were prepared as solutions in methoxypropan-2-ol for all the bottom coats; for example 12 the middle coat was prepared as a solution in toluene; for examples 1 to 13 and 16, the top coats were prepared as solutions in toluene and for examples 14 and 15, the top coats were prepared as solutions in butylacetate.

For examples 1 to 12, 14 and 15, the substrate used was copper substrate A. For example 13 the substrate used was copper substrate B. For example 16 the substrate used was the polyester substrate.

For examples 1, 2 and 3, the solution concentrations were selected to provide the specified dry film composition with coating weights of 4 $gm^{-2}$ for bottom coats and coating weights of 0.40 $gm^{-2}$ for top coats after thorough drying in a Mathis labdryer oven (as supplied by Werner Mathis AG, Germany) at 130° C. for 150 seconds.

For examples 4, 6, 14 and 15 the solution concentrations were selected to provide the specified dry film compositions with coating weights of 2 $gm^{-2}$ for the bottom coats and coating weights of 0.50 $gm^{-2}$ for the top coats after thorough drying in a Mathis labdryer oven at 130° C. for 150 seconds.

For examples 5, 7, 8, 9, 10 and 13 the solution concentrations were selected to provide the specified dry film compositions with coating weights of 2 $gm^{-2}$ for the bottom coats and coating weights of 0.25 $gm^{-2}$ for the top coats after thorough drying in a Mathis labdryer oven at 130° C. for 150 seconds.

For example 11, the solution concentration was selected to provide the specified dry film composition with a coating weight of 2 $gm^{-2}$ for the bottom coat after thorough drying in a Mathis labdryer oven at 130° C. for 150 seconds.

For example 12, the solution concentration was selected to provide the specified dry film composition with a coating weight of 2 $gm^{-2}$ for the bottom coat. a coating weight of 0.25 $gm^{-2}$ for the middle coat and a coating weight of 0.25 $gm^{-2}$ for the top coat after thorough drying in a Mathis labdryer oven at 130° C. for 150 seconds.

For example 16, the solution concentration was selected to provide the specified dry film composition with a coating weight of 2 $gm^{-2}$ for the bottom coat and a coating weight of 0.15 $gm^{-2}$ for the top coat after thorough drying in a Mathis labdryer oven at 130° C. for 150 seconds.

The compositions were as set out in the table below:

| Component | Examples | | | | | | | |
|---|---|---|---|---|---|---|---|---|
| | 1 | 2 | 3 | 4 | 5 | 6 | 7 | 8 |
| | Parts by weight | | | | | | | |
| Bottom Coats | | | | | | | | |
| Lyncur CBA | 54 | 57.6 | 49 | 49 | 49 | 49 | 49 | 49 |
| Lyncur M(S-4) | 40 | 40 | 40 | 40 | 40 | 40 | 40 | 40 |
| SDB 7047 | 5 | 1.4 | 10 | 10 | 10 | 10 | 10 | 10 |
| Crystal violet | 1 | 1 | 1 | 1 | 1 | 1 | 1 | 1 |
| LB6564 | | | | | | | | |
| Carbon Black | | | | | | | | |
| Top Coats | | | | | | | | |
| Poly(2-ethylhexyl methacrylate) | 100 | 75 | 100 | | | | | |
| Carbon black | | 25 | | | | | | |
| Finaprene | | | | 100 | 100 | | | |
| Poly(methyl methacrylate) Mw = 15000 | | | | | | 100 | 100 | |
| Poly(methyl methacrylate) Mw = 120000 | | | | | | | | 100 |

| Component | Examples | | | | | | |
|---|---|---|---|---|---|---|---|
| | 9 | 10 | 11 | 12 | 13 | 14 | 15 | 16 |
| | Parts by weight | | | | | | |
| Bottom Coats | | | | | | | |
| Lyncur CBA | 49 | 49 | 49 | 58 | 49 | 58 | 59 | |
| Lyncur M(S-4) | 40 | 40 | 40 | 40 | 40 | 40 | 40 | |
| SDB 7047 | 10 | 10 | 10 | 1 | 10 | 1 | | |
| Crystal violet | 1 | 1 | 1 | 1 | 1 | 1 | 1 | |
| LB6564 | | | | | | | | 70 |
| Carbon Black | | | | | | | | 30 |
| Middle Coats | | | | | | | | |
| Carbon Black | | | | 100 | | | | |

-continued

| Top Coats | | | | | | |
|---|---|---|---|---|---|---|
| Poly(methyl methacrylate) $M_w = 350000$ | 100 | | | | | |
| Piccolastic A75 | | 100 | | | | |
| Poly(methyl methacrylate) $M_w = 15000$ | | | 100 | 100 | | 100 |
| Nitrocellulose | | | | | 67 | 67 |
| Carbon black | | | | | 33 | 33 |

EXAMPLES 1 TO 15

A sample of each of the printed circuit board precursors was imaged in the Trendsetter 3244, using an internal test pattern, plot 0 at 6.5 W and a drum speed of 156 rpm for an imaging energy density of 300 mJcm$^{-2}$ and a drum speed of 94 rpm for an imaging energy density of 500 mJcm$^{-2}$.

The exposed precursors were then processed by immersing in developer B at 20° C. The time required to successfully develop away the coating in areas that had been struck by the laser is noted in the results table below. The time taken to remove the nonimaged area is also recorded. These results give an indication of processability.

The coated substrates were also subjected to a scratch test using a DUR-O-Test instrument manufactured by BYK-Gardner GmbH, of Geretsried, Germany.

The instrument consists of a sleeve containing a pressure spring that can be compressed to various tensions by means of a slide. This spring acts upon a protruding tungsten carbide needle. The spring can be replaced in order to change the force available to the user. The needle of the instrument was placed perpendicularly onto the coating. A line was drawn approximately 5 cm long within 1 second, while pressing the DUR-O-Test instrument against the specimen until the plane jacket end contacted the test surface. If the copper substrate was seen through the coating, the specimen failed the test, but if a mark was made on the coating but did not break through the coating, a pass was declared. The results table below details the largest force withstood by each sample, before copper substrate was seen.

A sample precursor from each of the examples 12 and 13, was also etched—uncovered copper removed, (after developing in developer B at 20° C. for 60 and 120 seconds respectively), by immersion in etching solution A, which was constantly being stirred for 1 minute at 40° C., using a spray processor (as supplied by PCB machinery Ltd. of Haslingden, Lancashire, UK). The areas of the coating that had not been struck by the laser and had not dissolved away in the developer, completely resisted the etch process. The precursors were then rinsed in water.

Finally the precursors were cleaned by rinsing in stripper A (to remove the remaining coating) at 20° C. for 60 seconds. The printed circuit board samples had copper patterns remaining that were accurate copies of the precursors above, after the development stages.

EXAMPLE 16

A sample of the mask precursors was imaged in the Trendsetter 3244, using an internal test pattern, plot 0 at 6.5 W and a drum speed of 156 rpm for an imaging energy density of 300 mJcm$^{-2}$ and a drum speed of 94 rpm for an imaging energy density of 500 mJcm$^{-2}$.

The exposed mask precursor was then processed by immersing in the developer A at 20° C. The time required to successfully develop away the coating in areas that had been struck by the laser is noted in the results table below. The time taken to remove the non-imaged area is also recorded. These results give an indication of processability.

| Example | Development time when imaged at 300 mJcm$^{-2}$ in seconds | Development time when imaged at 500 mJcm$^{-2}$ in seconds | Time required to dissolve away non-imaged coating in minutes |
|---|---|---|---|
| 16 | 200 | 140 | >30 |

A sample mask precursor from example 16 (after imaging at 300 MJcm−2 and developing in developer A at 20° C. for 200 seconds) was laid over a Kodak Polychrome Graphics Capricorn DH positive working printing plate precursor and the whole assembly was exposed on a Montakop UV light-

| Example | Development time when imaged at 300 mJcm$^{-2}$ in seconds | Development time when imaged at 500 mJcm$^{-2}$ in seconds | Time required to dissolve away non-imaged coating in minutes | DUR O-Test Result in Newtons |
|---|---|---|---|---|
| 1 | 90 | 30 | >30 | 20 |
| 2 | 180 | 40 | 10 | 20 |
| 3 | 60 | 30 | >30 | 20 |
| 4 | 160 | 60 | 12 | 20 |
| 5 | 140 | 60 | 12 | 20 |
| 6 | 140 | 50 | >30 | 8 |
| 7 | 75 | 25 | >30 | 8 |
| 8 | 140 | 30 | >30 | 8 |
| 9 | 140 | 30 | >30 | 8 |
| 10 | 60 | 35 | 3 | 20 |
| 11 (comparison) | 30 | 15 | | 8 |
| 12 | 60 | 15 | >30 | 12 |
| 13 | 120 | 75 | 15 | 12 |
| 14 | 50 | 20 | 4 | 20 |
| 15 | 40 | 25 | 4 | 20 | frame using a TH 3020 diazo bulb as supplied by Siefried Theimer GmbH of Germany. (This emits UV radiation predominantly distributed in the wavelength band 400–440 nm). The number of exposure units used was 100 with a 40:40 vacuum. The exposed Capricorn DH plate was processed by immersing in developer A at 20° C. for 60 seconds. The Capricorn DH plate coating dissolved away in the developer, where the UV radiation has passed through the mask, to leave a binary image.

While the invention has been described in terms of the foregoing specific embodiments, it will be apparent to those skilled in the art that various alterations and modifications may be made to the described embodiments without departing from the scope of the invention, which is limited only by the appended claims. The disclosed embodiments are provided merely by way of example.

The invention claimed is:

1. A method of making a mask or an electronic part, the method comprising the steps of:
    I) providing a precursor which comprises:
        a substrate having a conductive surface of copper or a copper-rich alloy; and
        a thermally sensitive composite layer structure having an inner surface contiguous to the substrate and an outer surface, the composite layer structure comprising:
            (a) a first layer having an inner surface, the first layer comprising a first polymeric material and a photothermal conversion material, wherein the first polymeric material is soluble or dispersible in an aqueous solution and the photothermal conversion material comprises an infrared absorbing compound; and
            (b) a second layer having an outer surface, the second layer comprising a second polymeric material, wherein the second layer is insoluble in the aqueous solution
    II) imagewise exposing the composite layer structure to thermal energy to provide exposed portions and complimentary unexposed portions in the composite layer structure, wherein the exposed portions of the composite layer structure are selectively removable by the aqueous solution; and
    (III) applying the aqueous solution to the outer surface to remove the exposed portions of the composite layer structure to produce an imaged article having uncovered areas of the substrate and complimentary remaining regions of the composite layer structure.

2. The method of claim 1 wherein exposed portions of the first layer of the composite layer structure have an increased rate of solubility or dispersibility in the aqueous solution.

3. The method of claim 1 wherein exposed portions of the second layer of the composite layer structure have enhanced permeability to the aqueous solution.

4. The method of claim 1 wherein the aqueous solution has a pH of about 6 or greater.

5. The method of claim 1 wherein the aqueous solution has a pH between about 8 and about 13.5.

6. The method of claim 1 wherein imagewise exposing is carried out with an infrared emitting laser.

7. The method of claim 1 wherein imagewise exposing is carried out with a thermal printing head.

8. The method of claim 1 wherein the method additionally comprises: (IV) etching the article in an etchant to remove the conductive surface of those regions from which the composite layer structure was removed.

9. The method of claim 1 wherein the substrate comprises a semiconductor surface and the method additionally comprises: (IV) doping revealed regions of the semiconductor surface.

* * * * *